(12) United States Patent
Abe et al.

(10) Patent No.: US 6,973,227 B2
(45) Date of Patent: Dec. 6, 2005

(54) OPTICAL COMMUNICATION DEVICE (75) Inventors: Akio Abe, Kawasaki (JP); Kazuya Sasaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 169 days.

(21) Appl. No.: 10/619,608

(22) Filed: Jul. 16, 2003

(65) Prior Publication Data
US 2004/0042706 A1 Mar. 4, 2004

(30) Foreign Application Priority Data
Aug. 27, 2002 (JP) .............................. 2002-246839

(51) Int. Cl.[7] .............................................. G02B 6/12
(52) U.S. Cl. ............................................ 385/14; 385/88
(58) Field of Search ................................. 385/14, 88

(56) References Cited

U.S. PATENT DOCUMENTS

| | | | | |
|---|---|---|---|---|
| 2,737,598 A | * | 3/1956 | Lewis et al. ............. 250/214 R |
| 4,531,285 A | * | 7/1985 | Lucas ........................... 29/827 |
| 4,694,183 A | * | 9/1987 | Merrick et al. ............. 250/551 |
| 4,757,197 A | * | 7/1988 | Lee ............................. 250/239 |
| 4,817,234 A | * | 4/1989 | Greulich ...................... 15/339 |
| 5,065,226 A | * | 11/1991 | Kluitmans et al. .......... 257/433 |
| 5,121,188 A | * | 6/1992 | Patridge et al. ............. 257/680 |
| 5,127,073 A | * | 6/1992 | Mulholland et al. .......... 385/92 |
| 5,136,152 A | * | 8/1992 | Lee .............................. 257/699 |
| 5,189,363 A | * | 2/1993 | Bregman et al. ............ 324/754 |
| 5,192,983 A | * | 3/1993 | Tokura ........................ 356/608 |
| 5,537,737 A | | 7/1996 | Kamakura et al. |
| 5,781,576 A | * | 7/1998 | Kimura et al. ........... 372/45.01 |
| 5,875,047 A | | 2/1999 | Abe et al. |
| 6,038,203 A | * | 3/2000 | Tajiri et al. ............... 369/112.1 |
| 6,154,592 A | * | 11/2000 | Tagashira ..................... 385/88 |
| 6,329,607 B1 | * | 12/2001 | Fjelstad et al. ............. 174/261 |
| 6,846,114 B2 | * | 1/2005 | Chiu et al. .................... 385/88 |
| 2003/0020146 A1 | * | 1/2003 | Yee et al. .................... 257/666 |
| 2004/0240800 A1 | * | 12/2004 | Uchida ......................... 385/92 |

* cited by examiner

Primary Examiner—Ellen E. Kim
(74) Attorney, Agent, or Firm—Staas & Halsey LLP (57) ABSTRACT There is provided an optical communication device in which a plurality of lands 45a and 45c of the printed board 32 connected to a plurality of main signal leads 50 and 51 of a co-axial laser diode module 34 are brought in proximity to the end 32a of the printed board 32, and a land 45b of the printed board 32 connected to an auxiliary signal lead 52 of the laser diode module 34 is situated farther away from the end 32a of the printed board 32 than the lands 45a and 45c. As a result, lengths of the main signal leads 50 and 51 can be shortened, and this limits degradation of pulse shapes of main signals and high-frequency characteristics of the device.

19 Claims, 7 Drawing Sheets

OPTICAL COMMUNICATION DEVICE

BACKGROUND OF THE INVENTION

1. Field of the Invention

The present invention relates to an optical communication device, particularly, to an optical communication device connected to an optical transmission line for optoelectronic conversion of signals.

2. Description of the Related Art

Optical communication devices of the related art have been disclosed, for example, in U.S. Pat. No. 5,875,047 (hereinafter, referred to as reference 1) and U.S. Pat. No. 5,537,737 (hereinafter, referred to as reference 2).

Figure 1A:
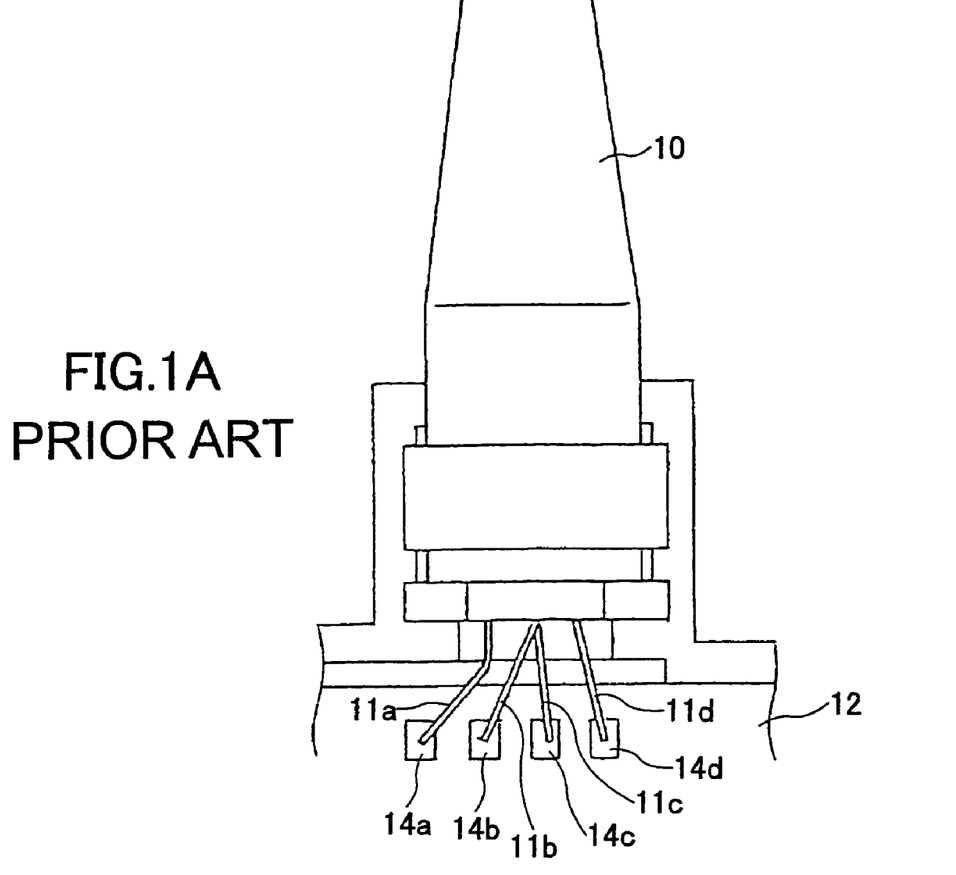
FIGS. 1A and 1B are a plan view and a bottom view, respectively, of an example of an optical communication device of the related art.
Figure 1B:
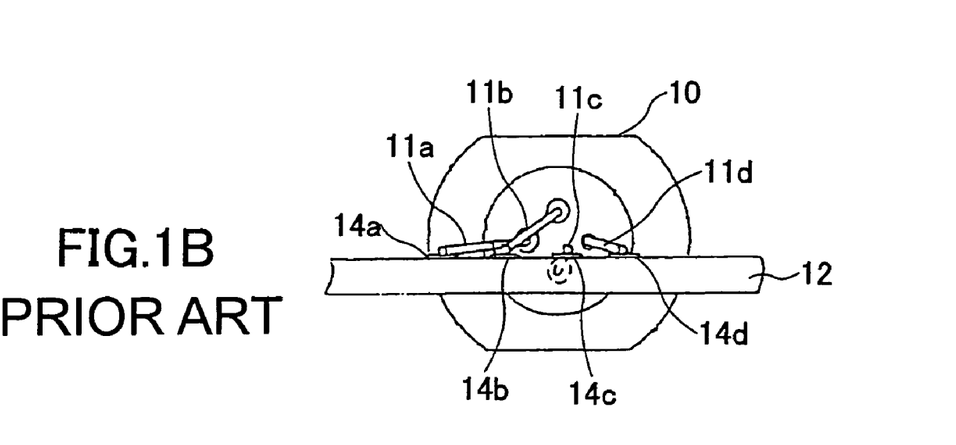

FIGS. 1A and 1B show a plan view and a bottom view respectively of an example of an optical communication device of the related art disclosed in reference 1. This device is a so-called receptacle-type optical module not including an optical fiber cord. In FIGS. 1A and 1B, a co-axial LD (Laser Diode) module 10 has leads 11a through 11d. On a printed board 12 and at a distance away from an end thereof, lands 14a through 14d are arranged in a row, and the ends of leads 11a through 11d are directly connected to lands 14a through 14d, respectively.

Figure 2:
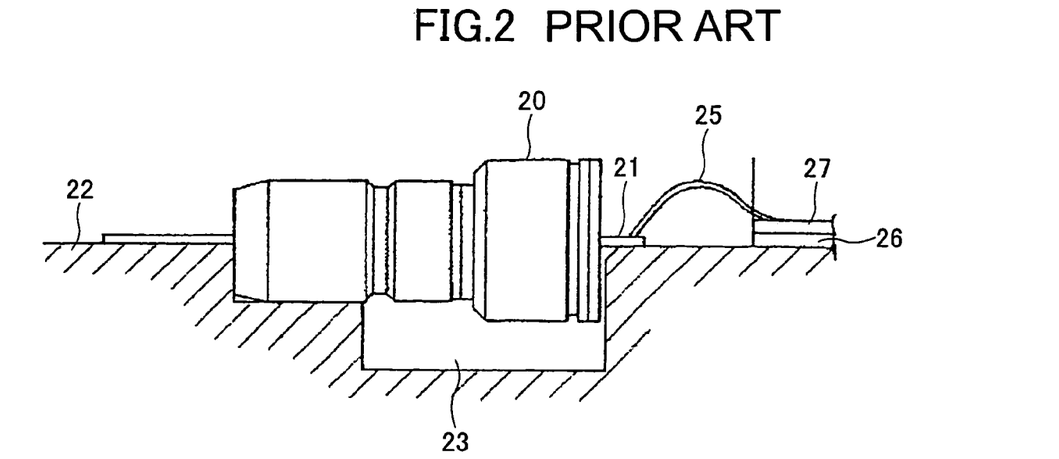
FIG. 2 is a side view of another example of an optical communication device of the related art.

FIG. 2 shows a side view of an example of an optical communication device of the related art disclosed in reference 2. In FIG. 2, a lead 21 of a co-axial LD module 20 is planarized. The co-axial LD module 20 is held in a recess 23 formed in a base 22, and the planarized lead 21 is connected to a land 27 provided on a printed board 26 by a bonding wire 25.

In the device of the related art shown in FIGS. 1A and 1B, however, because land 14a through 14d are arranged at a certain distance away from an end of the printed board 12, leads 11a through 1id are long, and inductances of leads 11a through 1id increase. Because of this, the pulse shapes of main signals lose sharpness when supplied to the co-axial LD module 10 via any one of leads 11a through 11d, and therefore the high frequency characteristics of the device are degraded. As a solution to this problem, a correction circuit of pulse shape degradation of the main signals may be included, but this increases the size of relevant circuits.

In the device of the related art shown in FIG. 2, because of the limitation of the outer shape of the apparatus for wire bonding, the portion of the lead 21 to be planarized has to be set at a position away from the co-axial LD module 20, and therefore, lead 21 becomes long. Further, in order to prevent disconnection, the bonding wire 25 has to be made a loop-shaped one, resulting in a long bonding wire 25. Because the bonding wire 25 is rather thinner than lead 21, its associated inductance increases, and again the problem occurs that pulse shapes of main signals lose sharpness when supplied to the co-axial LD module 20, and the high frequency characteristics of the device are degraded.

SUMMARY OF THE INVENTION

Accordingly, it is a general object of the present invention to solve the above problems of the related art.

A more specific object of the present invention is to provide an optical communication device able to limit degradation of pulse shapes of main signals and high-frequency characteristics of the device.

To attain the above object, according to a first aspect of the present invention, there is provided an optical communication device comprising a printed board, a co-axial laser diode module connected to the printed board, a plurality of main signal leads on the co-axial laser diode module, an auxiliary signal lead on the co-axial laser diode module, and a plurality of lands on the printed board and connected to the main signal leads and the auxiliary signal lead, wherein the lands connected the main signal leads are arranged in proximity to an end of the printed board, and the land connected to the auxiliary signal lead is situated farther away from the end of the printed board than the lands connected the main signal leads.

According to the above invention, the lengths of the main signal leads can be shortened, enabling suppression of degradation of pulse shapes of the main signals and high-frequency characteristics.

Preferably, in the optical communication device, the land of the printed board connected to the auxiliary signal lead of the co-axial laser diode module is enclosed in an insulating material, and the lands connected to the main signal leads of the co-axial laser diode module are enclosed in the insulating material except for their sides at the end of the printed board.

According to the above invention, it is possible to prevent circuit shorting between the land of the printed board for connecting the auxiliary signal lead and the lands of the printed board for connecting the main signal leads.

Preferably, in the optical communication device, the co-axial laser diode module is arranged so that the main signal leads are in proximity of the printed board.

According to the above invention, lengths of the main signal leads can be shortened, enabling suppression of degradation of pulse shapes of the main signals and high-frequency characteristics.

These and other objects, features, and advantages of the present invention will be more apparent from the following detailed description of the preferred embodiments given with reference to the accompanying drawings.

DESCRIPTION OF THE PREFERRED EMBODIMENTS

Below, preferred embodiments of the present invention will be explained with reference to the accompanying drawings.

Figure 3:
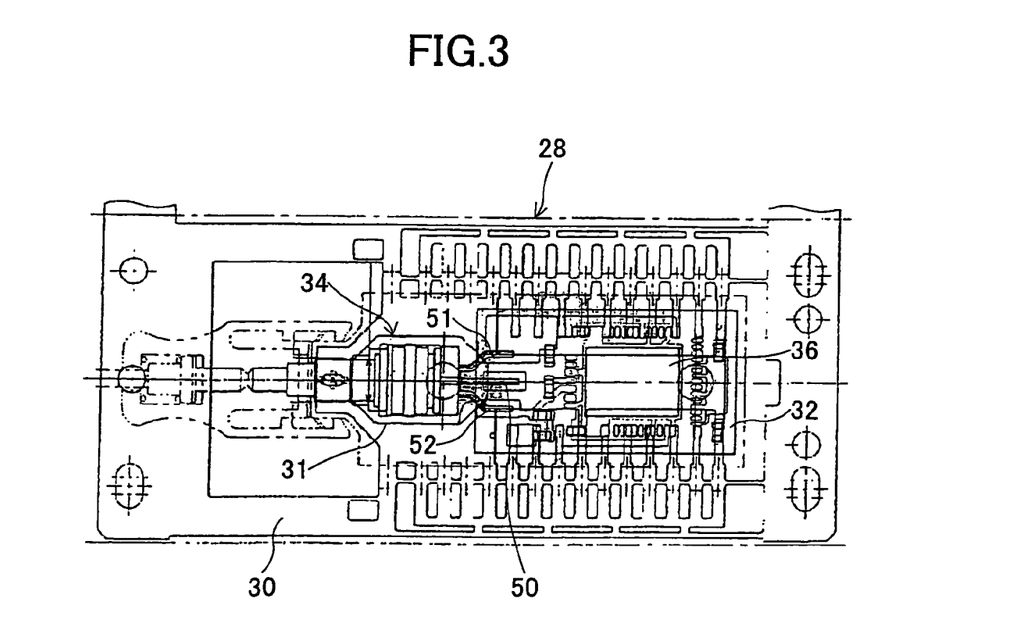
FIG. 3 is a plan view of an embodiment of an optical communication device related to the present invention.
Figure 4:
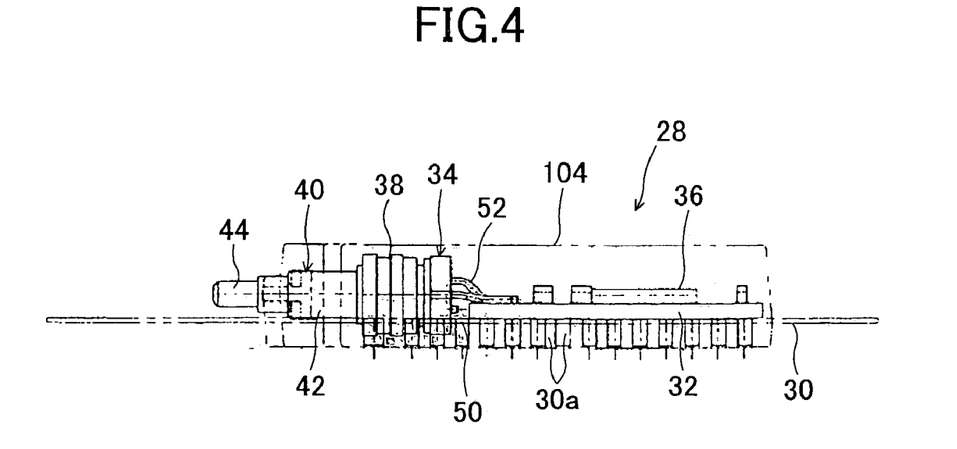
FIG. 4 is a front view of the embodiment of the optical communication device related to the present invention.

FIG. 3 is a plan view of an embodiment of an optical communication device 28 according to the present invention, and FIG. 4 is a front view of the optical communication device 28. Note that FIG. 3 shows the device before forming the leads, while FIG. 4 shows the device after forming the leads.

In FIG. 3 and FIG. 4, a printed board 32 and an LD (Laser Diode) module 34 are mounted on a lead frame 30 having a number of leads 30a. The LD module 34 includes an LD package 38 having a laser diode, lenses and others, and a ferrule assembly 40 fixed on the LD package 38.

The ferrule assembly 40 is comprised of a metal member 42 having a bore, a zirconia capillary 44 fitted into the bore of the metal member 42, and an optical fiber fitted into the zirconia capillary 44.

The lead frame 30 has an opening 31, and a portion of the LD package 38 of the LD module 34 is inserted into the opening 31. The LD module 34 is mounted on the lead frame 30 by welding the metal member 42 of the ferrule assembly 40 to the lead frame 30. Further, a driver IC (Integrated Circuit) 36 is mounted on the printed board 32 to supply main signals to the LD to drive it.

Figure 5:
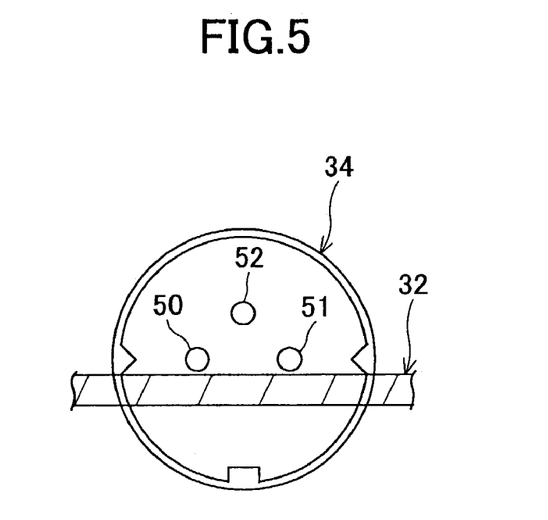
FIG. 5 is a bottom view of an LD module.

As shown in the bottom view in FIG. 5, the LD module 34 is comprised of main signal leads 50 and 51, and an auxiliary signal lead 52. The driving signal of the LD is supplied to the main signal leads 50 and 51, and the auxiliary signal lead 52 is a lead of a PD (photo diode) held in the LD package 38 and used for monitoring. The main signal lead 51 is set at a common potential, and is commonly used by the main signals and the output of the auxiliary signal of the photo diode.

As shown in FIG. 5, the LD module 34 is arranged in such a way that the main signal leads 50 and 51 are brought in close proximity to the printed board 32, and the auxiliary signal lead 52 is arranged at a distance away from the printed board 32.

Figure 6:
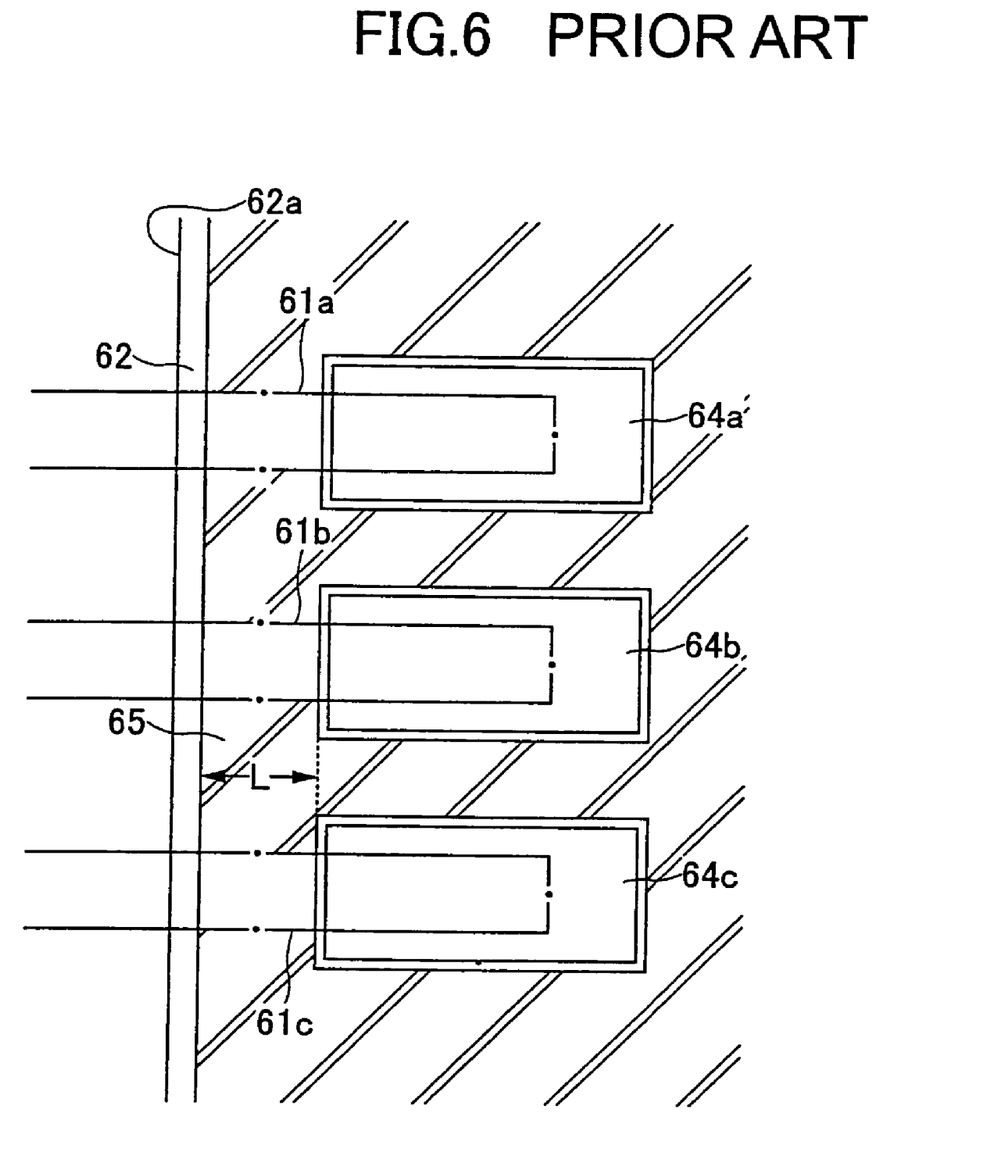
FIG. 6 is a plan view of a printed board of the related art.

In a printed board 62 of the related art, as shown in FIG. 6, lands 64a through 64c are arranged in a row at a distance L away from an end 62a of the printed board 62, and insulating resist ink 65 (the hatched area) is coated around lands 64a through 64c. With such a printed board 62, as lands 64a through 64c are separated from the end 62a, leads 61a, 61b and 61c are long.

Figure 7:
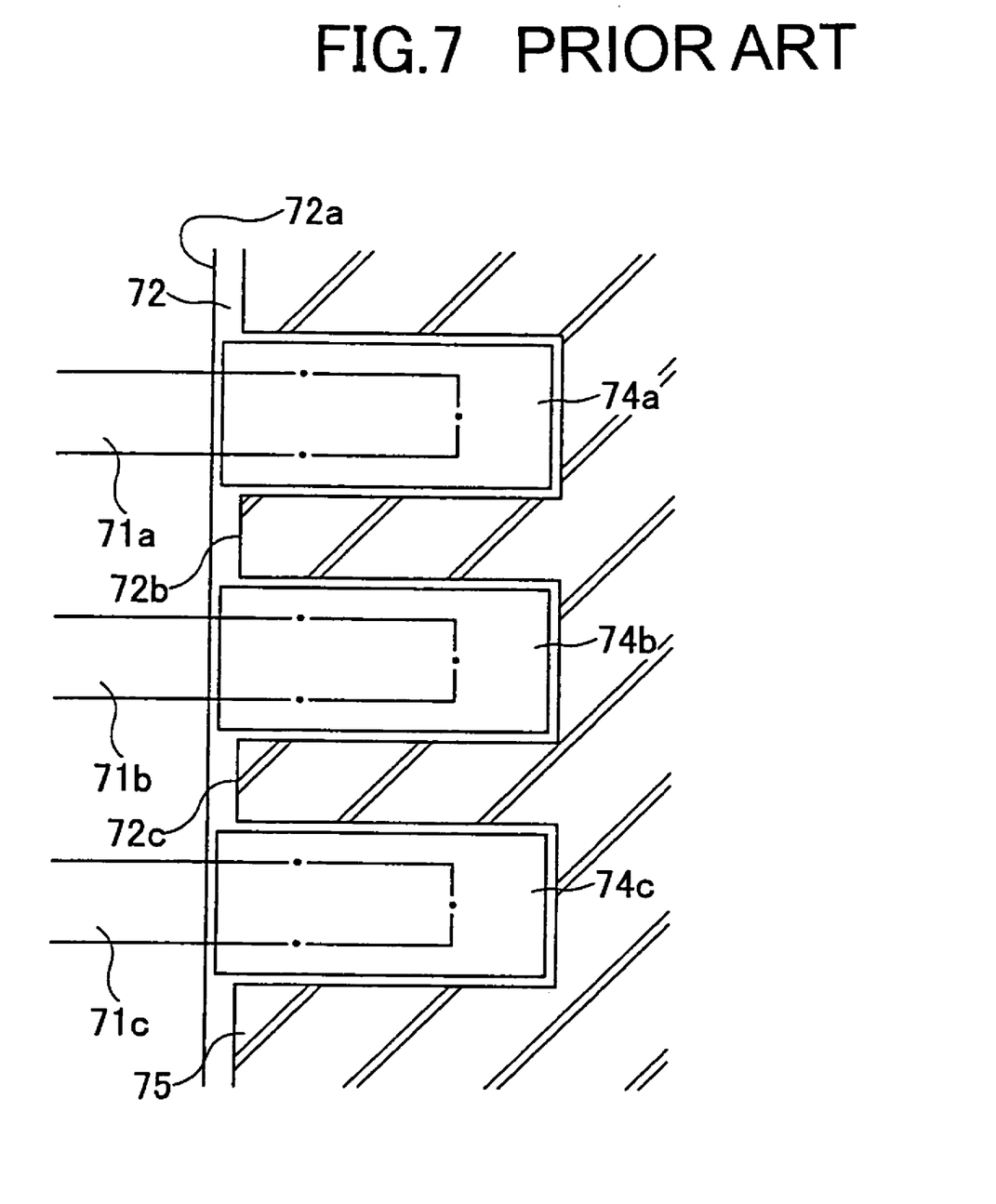
FIG. 7 is a plan view of an example of a printed board according to the related art.

In order to shorten the lengths of these leads, as shown in FIG. 7, a method might be conceived to bring lands 74a through 74c in a row closer to the end 72a of the printed board 72. But in this case, it is difficult to coat the resist ink 75 (the hatched area) of a finite thickness up to the end 72a of the printed board 72. The resist ink 75 functions as walls to prevent a thermal setting conductive adhesive agent for bonding lands 74a through 74c with leads 71a through 71c, respectively, from leaking out to the surrounding of these lands. Therefore, without the resist ink 75 being coated on the printed board 72, circuit shorting may take place between lands 74a and 74b, or lands 74b and 74c.

Figure 8:
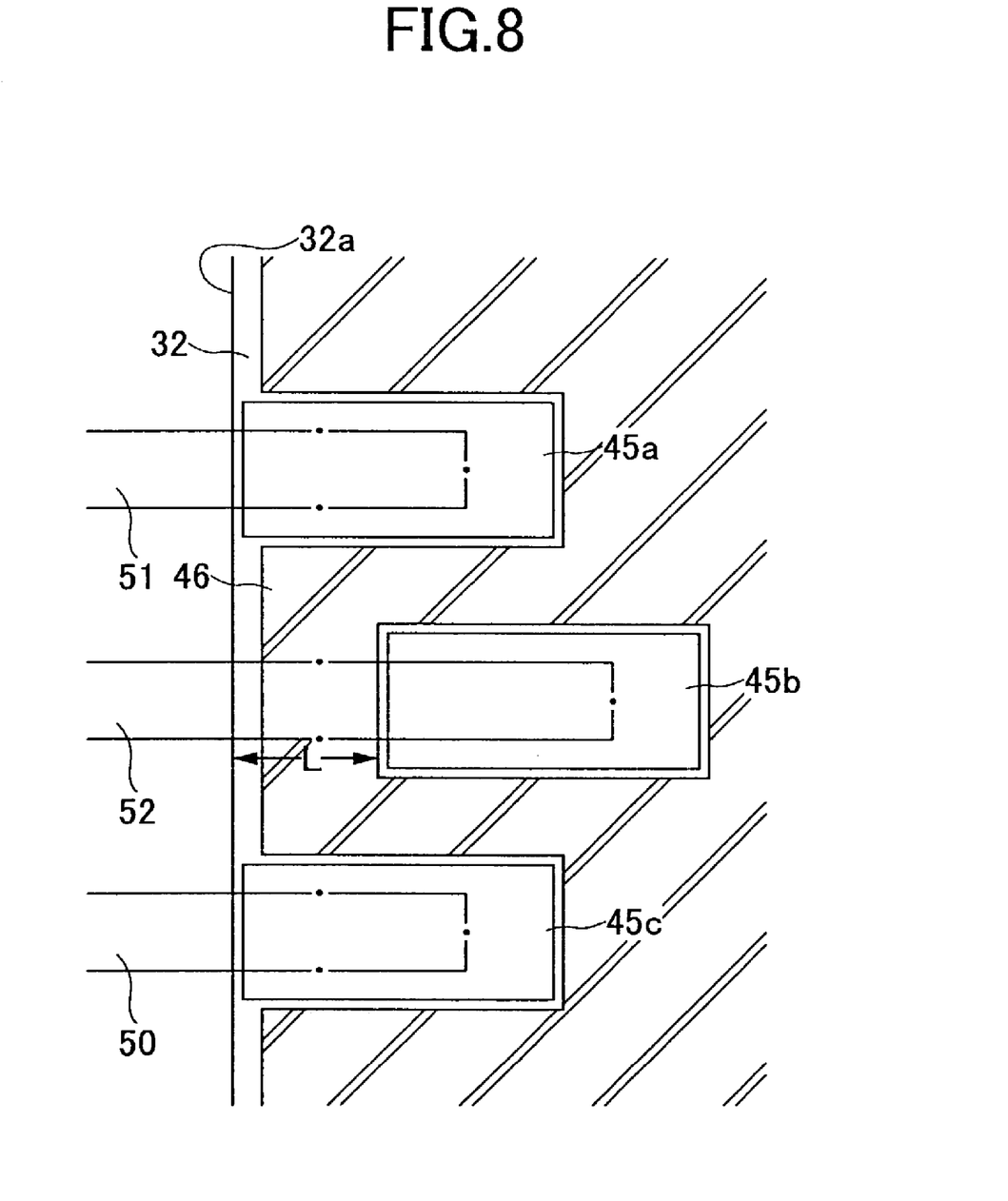
FIG. 8 is a plan view of a printed board of the present invention.

To solve this problem, in the present invention, as shown in FIG. 8, lands 45a and 45c are brought closer to the end 32a of the printed board 32, and the land 45b is set at a distance L away from the end 32a and between lands 45a and 45c. The main signal leads 51 and 50 are connected to lands 45a and 45c with a thermal setting conductive adhesive agent or a solder, and the auxiliary signal lead 52 is connected to land 45b also by a thermal setting conductive adhesive agent or a solder.

Lands 45a and 45c are enclosed in the resist ink 46 (the hatched area) having a certain thickness except for their sides at the end 32a, while land 45b is completely enclosed in the resist ink 46. In this case, even if the thermal setting conductive adhesive agent or solder leaks out more or less from lands 45a and 45c to the end 32a of the printed board 32 not coated with the resist ink 46, since lands 45a and 45c are largely separated, circuit shorting will not happen there. In addition, because the land 45b is away from the ends 32a by a distance L, and enclosed by the resist ink 46, shorting will not happen between lands 45a and 45b, or lands 45b and 45c.

Further, because lands 45a and 45c for connecting the main signal leads 51 and 50 are brought in proximity to the end 32a of the printed board 32, and furthermore, because the LD module 34 is arranged so that the main signal leads 51 and 50 are very close to the printed board 32, lengths of leads 50 and 51 can be shortened. Accordingly, degradation of pulse shapes of the main signals and high-frequency characteristics can be suppressed. Note that even though the auxiliary signal lead 52 is somewhat long, the monitor output of the photodiode is not degraded too much and there is not any problem in practical use.

Figure 9A:
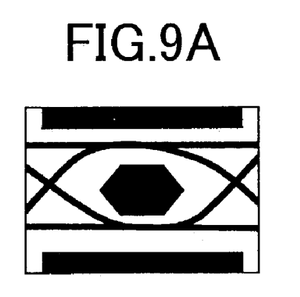
FIGS. 9A–9B and 9C–9D are views showing simulation results of optical communication devices of the present invention and the related art, respectively.
Figure 9B:
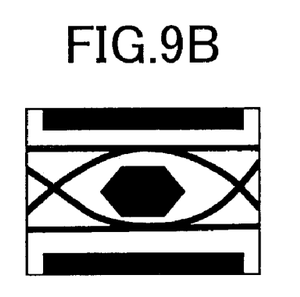

FIGS. 9A through 9D are views showing simulated eye-patterns of optical communication devices of the present invention and the related art, respectively. FIG. 9A shows an eye-pattern under an ideal condition of the optical communication device of the present invention in which leads 50 and 51 are shortened. FIG. 9B shows an eye-pattern under a bad condition of the optical communication device of the present invention in which leads 50 and 51 are shortened. Note that an eye-pattern indicates zero signal identification errors and thus good characteristics when the eye-pattern is located within the area between the top and bottom rectangles and the hexagon at the center. So, the eye-patterns in both FIG. 9A and FIG. 9B have certain margins, indicating that good characteristics are obtained.

Figure 9C:
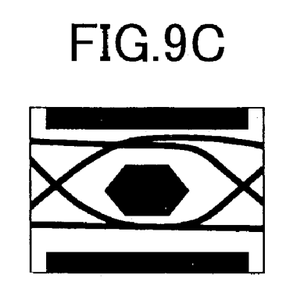
Figure 9D:
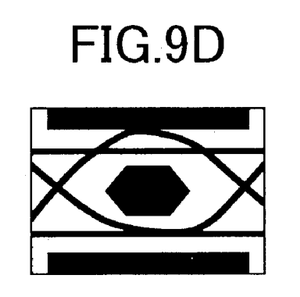

In contrast, FIG. 9C shows an eye-pattern under an ideal condition of an optical communication device of the related art in which leads 61a and 61c are long. As shown in FIG. 9C, the upper part of the eye-pattern is close to the top rectangle and sufficient margin cannot be obtained. FIG. 9D shows an eye-pattern under a bad condition of the optical communication device of the related art in which leads 61a and 61c are long. As shown in FIG. 9D, the upper part of the eye-pattern overlaps with the top rectangle and the desired characteristics cannot be obtained.

Note that the resist ink 46 corresponds to the insulating material in the claims.

While the invention has been described with reference to specific embodiments chosen for purpose of illustration, it should be apparent that the invention is not limited to these embodiments, but numerous modifications could be made thereto by those skilled in the art without departing from the basic concept and scope of the invention.

Summarizing the effect of the invention, according to the present invention, lengths of the main signal leads can be shortened, thereby enabling suppression of degradation of pulse shapes of main signals and high-frequency characteristics of the device. In addition, it is possible to prevent circuit shorting between the land of the printed board for connecting the auxiliary signal lead and the lands of the printed board for connecting a plurality of main signal leads.

This patent application is based on Japanese priority patent application No. 2002-246839 filed on Aug. 27, 2002, the entire contents of which are hereby incorporated by reference.

What is claimed is:

1. An optical communication device, comprising:
a printed circuit board;
an optical element module arranged near a first side of the printed circuit board and having a first surface perpendicular to the printed circuit board;
a plurality of driving signal leads provided on the first surface of the optical element module for supplying driving signals to the optical element module;
a monitoring signal lead provided on the first surface of the optical element module for supplying a monitoring signal to the optical element module;
a plurality of driving signal lands provided on the printed circuit board and connected to the driving signal leads and a monitoring signal land connected to the monitoring signal lead;

wherein the driving signal lands connected to the driving signal leads are arranged near the first side of the printed circuit board so as to reduce lengths of the driving signal leads; and the monitoring signal land connected to the monitoring signal lead is situated farther away from the first side of the printed circuit board than the lands connected to the driving signal leads so as to increase the physical separation between the driving signal lands.

2. The optical communication device as claimed in claim 1, wherein the monitoring signal land connected to the monitoring signal lead is enclosed in an insulating material.

3. The optical communication device as claimed in claim 2, wherein the driving signal lands connected to the driving signal leads are enclosed in the insulating material except for the sides of the lands near the first side of the printed circuit board.

4. The optical communication device as claimed in claim 1, wherein the optical element module is arranged so that the driving signal leads are nearer to the printed circuit board than the monitoring signal lead.

5. The optical communication device as claimed in claim 4, wherein the optical element module is arranged so that the driving signal leads are near the first side of the printed circuit board.

6. The optical communication device as claimed in claim 1, wherein one of the driving signal leads are set at a common potential, and is commonly used by the driving signals and the monitoring signal.

7. A method comprising:
providing a printed circuit board;
arranging an optical element module near a first side of the printed circuit board and having a first surface perpendicular to the printed circuit board;
arranging a plurality of driving signal leads on the first surface of the optical element module for supplying driving signals to the optical element module;
arranging a monitoring signal lead on the first surface of the optical element module for supplying a monitoring signal to the optical element module;
providing a plurality of driving signal lands on the printed circuit board to connect to the plurality of driving signal leads;
providing a monitoring signal land on the printed circuit board to connect to the monitoring signal lead; and
positioning the monitoring signal land connected to the monitoring signal lead farther away from the first side of the printed circuit board than the plurality of driving signal lands connected to the plurality of driving signal leads so as to increase the physical separation between the plurality of driving signal lands thereby suppressing degradation of pulse shapes and high-frequency characteristics of the driving signals in the optical communications device.

8. The method according to claim 7, further comprising:
enclosing the monitoring signal land connected to the monitoring signal lead in an insulating material.

9. The method according to claim 8, further comprising:
enclosing the driving signal lands connected to the driving signal leads in an insulating material except for sides of the driving signal lands on the first side of the printed circuit board.

10. The method according to claim 7, further comprising:
arranging the optical element module so that the plurality of driving signal leads are nearer to the first side of the printed circuit board than the monitoring signal lead.

11. The method according to claim 10, further comprising:
arranging the optical element module so that the plurality of driving signal leads are near the first side of the printed circuit board.

12. The method according to claim 7, further comprising:
setting one of the driving signal leads at a common potential, such that it is commonly used by the driving signals and the monitoring signal.

13. An Apparatus comprising:
a printed circuit board;
an optical element module near a first side of the printed circuit board and having a first surface perpendicular to the printed circuit board;
a plurality of driving signal leads on the first surface of the optical element module for supplying driving signals to the optical element module;
monitoring signal leads on the first surface of the optical element module for supplying one or more monitoring signals to the optical element module;
a plurality of driving signal lands on the printed circuit board to connect to the plurality of driving signal leads; and
a monitoring signal land connected to the monitoring signal lead;
wherein, the monitoring signal land connected to the monitoring signal lead is positioned farther away from the first side of the printed circuit board than the plurality of driving signal lands connected to the plurality of driving signal leads so as to increase the physical separation between the plurality of driving signal lands.

14. The apparatus according to claim 13, further comprising:
enclosing the monitoring signal land connected to the monitoring signal lead in an insulating material.

15. The apparatus according to claim 14, further comprising:
enclosing the driving signal lands connected to the driving signal leads in an insulating material except for sides of the driving signal lands on the first side of the printed circuit board.

16. The apparatus according to claim 13, further comprising:
arranging the optical element module so that the driving signal leads are nearer to the first side of the printed circuit board than the monitoring signal lead.

17. The apparatus according to claim 16, further comprising:
arranging the optical element module so that the driving signal leads are near the first side of the printed circuit board.

18. The apparatus according to claim 16, further comprising:
enabling the suppression of degradation of pulse shapes and high-frequency characteristics of the driving signals by shortening the lengths of the driving signal leads.

19. The apparatus according to claim 13, further comprising:
setting one of the driving signal leads at a common potential, such that it is commonly used by the driving signals and the monitoring signal.

* * * * *